United States Patent [19]
Sato et al.

[11] Patent Number: 5,576,995
[45] Date of Patent: Nov. 19, 1996

[54] METHOD FOR REWRITING A FLASH MEMORY

[75] Inventors: Shinichi Sato; Katsuji Iguchi, both of Nara, Japan

[73] Assignee: Sharp Kabushiki Kaisha, Osaka, Japan

[21] Appl. No.: 547,158

[22] Filed: Oct. 24, 1995

[30] Foreign Application Priority Data

May 30, 1995 [JP] Japan .................................. 7-131951

[51] Int. Cl.$^6$ .................................................. G11C 16/02
[52] U.S. Cl. .............................. 365/185.33; 365/185.18; 365/185.28; 365/185.29
[58] Field of Search ...................... 365/185.33, 185.18, 365/185.27, 185.28, 185.29, 189.01, 218

[56] References Cited

U.S. PATENT DOCUMENTS

| | | | |
|---|---|---|---|
| 5,243,559 | 9/1993 | Murai | 365/185.27 |
| 5,341,342 | 8/1994 | Brahmbhatt | 365/185.27 |
| 5,402,373 | 3/1995 | Aritome et al. | 365/185.29 |
| 5,432,740 | 7/1995 | D'Arrigo et al. | 365/185.27 |
| 5,457,652 | 10/1995 | Brahmbhatt | 365/182 |
| 5,487,033 | 1/1996 | Keeney et al. | 365/185.27 |
| 5,515,319 | 5/1996 | Smayling et al. | 365/185.27 |

FOREIGN PATENT DOCUMENTS 6-204491  7/1994  Japan .

OTHER PUBLICATIONS

IEEE Journal Of Solid-State Circuits, vol. 27, No. 11, Nov. 1992, pp. 1547–1553, JINBO et al.

*Primary Examiner*—Tan T. Nguyen
*Attorney, Agent, or Firm*—Nixon & Vanderhye, P.C.

[57] ABSTRACT

A method for rewriting a flash memory wherein a plurality of memory cells each of which comprises a pair of source and drain, a floating gate and a control gate are arranged in matrix in a first conductivity-type well formed in a second conductivity-type deep well formed in the first conductivity-type semiconductor substrate; and in which the floating gate is charged with electrons when the flash memory is written and the floating gate is discharged of the electrons when the flash memory is erased; in which the erasure of the flash memory is operated by applying to the first conductivity-type well a first positive voltage different from the potential of the substrate, applying to the source or the drain a second positive voltage higher than the first positive voltage and applying to the control gate a first negative voltage.

6 Claims, 3 Drawing Sheets

METHOD FOR REWRITING A FLASH MEMORY

BACKGROUND OF THE INVENTION

1. Field of the Invention

The present invention relates to methods of rewriting a flash memory, more particularly, to methods of rewriting a flash memory with floating gates.

2. Description of Related Art

The conventional flash memories with floating gates are roughly classified, based on the structure of cell array, into two types, the NAND type and the NOR type. Now the NOR type is prevailing due to the greater reading speed thereof.

FIG. 3 shows a diagram illustrating an equivalent circuit of a cell array of an NOR-type flash memory. In FIG. 3, each of the reference characters M11, M12, M1n, M21 and Mn1 denotes a memory cell which has a floating gate. Each of the memory cells M11, M12 and M1n is connected to a word line WL1 through a control gate. The memory cell M21 is connected to a word line WL2 through a control gate, and the memory cell Mn1 is connected to a word line WLn through a control gate. Each of the memory cells M11, M12, M1n, M21 and Mn1 is also connected to a common source line SL through a source. Each of the memory cells M11, M21, Mn1 is connected to a bit line BL1 through a drain, the memory cell M12 is connected to a bit line BL2 through a drain and the memory cell M1n is connected to a bit line BLn through a drain.

The cell array constructed as described above is generally formed in a well of a desired conductivity type on a semiconductor substrate. Peripheral circuits with CMOS and the like may also be formed in a plurality of wells each having any desired conductivity type on the substrate.

There are four main methods for rewriting the above mentioned NOR-type flash memories by releasing electrons out of the floating gate to the source:

The table 1 shows an example of a first method.

TABLE 1

|  | Substrate | Source | Drain | Control Gate |
| --- | --- | --- | --- | --- |
| Writing | 0 V | 0 V | +5 V | +12 V |
| Erasing | 0 V | +12 V | open | 0 V |
| Reading | 0 V | 0 V | +2 V | +5 V |

According to this method, the writing is operated by injection into the floating gate of hot electrons which are generated in a channel by applying 0 V to the substrate and the source, a relatively high positive voltage (+5 V) to the drain, and a high voltage (+12 V) to the control gate. The erasing is operated by release of electrons from the floating gate to the source with FN (Fowler-Nordheim) current caused by applying 0 V to the substrate and the control gate, making the drain open and applying a high voltage (+12 V) to the source. In reading, the written or unwritten state of a memory cell is discriminated by the magnitude of the current that flows through the memory cell caused by applying 0 V to the substrate and the source, a low positive voltage (+2 V) to the drain and a relatively high voltage (+5 V) to the control gate.

The above described rewriting method has disadvantage in the cell size reduction because it is necessary to secure the sufficient junction breakdown voltage of the source due to the high voltage applied to the source when the memory cell is erased and therefore the junction of the source should be deep and the channel needs to be sufficiently long.

A second method is a method wherein lower voltage is applied to the source when the memory cell is erased. The table 2 shows an example thereof.

TABLE 2

|  | Substrate | Source | Drain | Control Gate |
| --- | --- | --- | --- | --- |
| Writing | 0 V | 0 V | +5 V | +12 V |
| Erasing | 0 V | +5 V | open | −12 V |
| Reading | 0 V | 0 V | +2 V | +5 V |

The method is different from the first method in that the leakage current passing from the source to the substrate is reduced (up to ⅒) by applying a negative voltage (−12 V) to the control gate in erasing. The operations for writing and reading are the same as in the first method. In addition, in the second method, the potential difference between the source and the control gate is larger than that in the first method so that the same or larger potential difference can be secured between the floating gate and the source compared with the potential difference between the floating gate and the source in the first method.

In the above described second method, a flash memory shown in FIG. 4 is essential because the negative voltage is applied in erasing. That is, an NMOS 28 included in a peripheral circuit Ca which serves to supply the voltage to a memory cell Ma must be formed in a P-well 23 which is electrically separated from a P-type substrate 20 by a deep N-well 24 in order that a source and drain region 29 where N$^+$ is diffused may be reversely biased to the P-well 23; and when the negative voltage is applied, the maximum negative voltage must be applied to the P-well 23 via a terminal 27, although the P-type substrate 20 should be biased at 0 V. In the flash memory shown in FIG. 4, the memory cell Ma is formed in a P-well 21 disposed in the surface layer of the P-type substrate 20. To the P-type substrate 20 a desired voltage is applied via a terminal 25. Additionally, since a CMOS is also included in the peripheral circuit Ca, a plurality of wells (e.g. an N-well 22) besides the above P-well are also formed, to each of which a desired voltage is applied via a terminal (for example to the N-well 22 the power supply voltage is applied via a terminal 26).

A third method is shown in the table 3.

TABLE 3

|  | Substrate | Source | Drain | Control Gate |
| --- | --- | --- | --- | --- |
| Writing | 0 V | 0 V | +5 V | +12 V |
| Erasing | 0 V | 0 V | open | +18 V |
| Reading | 0 V | 0 V | +2 V | +5 V |

The third method is different from the first and second methods in that the written and erased states of a memory cell in the third method are opposite to those in the first and second methods: In the first and second methods, the memory cell is charged with electrons when it is written and is discharged of electrons when it is erased; in the third method, on the contrary, the memory cell is discharged of electrons when it is written and is charged with electrons when it is erased. In the third method, the writing is operated by release of electrons from the floating gate with FN (Fowler-Nordheim) current caused by applying 0 V to the P-type substrate, making the source open, applying a high negative voltage (−12 V) to the control gate and a relatively high positive voltage (+5 V) to the drain. The erasing is operated by injection of electrons with FN current into the floating gate from a channel in the substrate which is induced by applying 0 V to the substrate and the source, making the drain open and applying a high positive voltage (+18 V) to the control gate. The third method has the advantage of saving the electric power employed because the third method, utilizing the FN current in writing, needs smaller current (up to $1/10^5$) in writing than the first and second methods. In reading, the third method is the same as the first and second methods.

The above described third method also needs a flash memory as shown in FIG. 4 since the high negative voltage is applied to the control gate in writing as in the second method.

Further as an improved third method, the fourth method shown in the table 4 is known.

TABLE 4

|  | Substrate | P-well | Source | Drain | Control Gate |
|---|---|---|---|---|---|
| Writing | 0 V | 0 V | open | +5 V | −12 V |
| Erasing | 0 V | −8 V | −8 V | open | +10 V |
| Reading | 0 V | 0 V | 0 V | +2 V | +5 V |

As shown in FIG. 5, a P-well 34 in a peripheral circuit Cb, formed in a deep N-well 35, is electrically separated from a P-type substrate 30, a terminal 38 serving to apply a desired voltage to the P-well. And at the same time a P-type region (P-well 32) which provides a channel for a memory cell Mb is also electrically separated by a deep N-well 31, a terminal 36 serving to apply a relatively high negative voltage (−8 V) to the P-well 32 and the source in erasing. Thus, the positive voltage applied to the control gate in erasing is reduced. Additionally, since a CMOS is formed in the peripheral circuit Cb of the flash memory shown in FIG. 5, a plurality of wells (e.g. an N-well 33) besides the above P-well are formed, to each of which a desired voltage is applied via a terminal (for example to the N-well 33 the power supply voltage is applied via a terminal 37).

Further, a fifth method is shown in the table 5 which differs from the first and second methods in the erasing mode.

TABLE 5

|  | Substrate | P-well | Source | Drain | Control Gate |
|---|---|---|---|---|---|
| Writing | 0 V | 0 V | 0 V | +5 V | +12 V |
| Erasing | 0 V | 5 V | open | open | −13 V |
| Reading | 0 V | 0 V | 0 V | +1 V | +5 V |

The method also needs a flash memory as shown in FIG. 5. The erasing is operated by releasing electrons out of the floating gate to the P-well by providing a large potential difference between the control gate and the P-well. This method is called channel erasing (or substrate erasing) since the P-well 32 corresponds to the channel of the memory cell Mb.

The erasing method is not suitable for the reduction of the employed voltage because the method generally has the disadvantage of requiring high voltages. The reason will be explained in the following paragraphs by comparing the method with the second one:

The erasing state is determined by the potential difference between the floating gate and the source in the second method, while in the fifth method the erasing is introduced by the potential difference between the floating gate and the P-well. The potential of the floating gate is determined by the coupling capacitances with the control gate, the source, the drain and the channel (the P-well) and expressed in the following formula:

$$Vfg = Ccg \times Vcg + Cs \times Vs + Cd \times Vd + Cpw \times Vpw$$

wherein the reference characters Vfg, Vcg, Vs, Vd, Vpw, Ccg, Cs, Cd and Cpw are the potential of the floating gate, the potential of the control gate, the potential of the source, the potential of the drain, the potential of the P-well, the coupling capacitance ratio of the floating gate to the control gate, the coupling capacitance ratio of the floating gate to the source, the coupling capacitance ratio of the floating gate to the drain and the coupling capacitance ratio of the floating gate to the P-well respectively.

In general, the coupling capacitance ratio Ccg of the floating gate to the control gate is about 0.6, the coupling capacitance ratio Cs of the floating gate to the source is about 0.05, the coupling capacitance ratio Cd of the floating gate to the drain is about 0.05 and the coupling capacitance ratio Cpw of the floating gate to the P-well is about 0.3.

In the fifth method, the source and drain are open respectively, in erasing and the voltage of the source and drain are determined respectively, by the coupling capacitances with the control gate (via the floating gate) and the P-well, and is almost equal to the voltage of the P-well since the coupling capacitance with the P-well is dominantly large. Therefore, by calculating the voltages given in the table 5, about −5.8 V is obtained for the potential Vfg of the floating gate in erasing, the potential difference between the floating gate and the P-well being about 10.8 V.

Whereas in the second method, supposing that Vcg is −10 V and Vs is 5 V in erasing, 5.75 V is obtained by calculation for the potential Vfg of the floating gate, the potential difference between the floating gate and the source being 10.75 V.

The erasing state in the fifth method at Vcg=−13 V and Vpw=5 V is almost equivalent to the erasing state in the second method at Vcg=−10 V and Vs=5 V, and it is recognized that the second method is more suitable for the reduction of the employed voltage than the fifth method.

As the fine pattern fabrication technology has been developing recently, there is a growing tendency to reduce cell sizes, even a transistor whose gate length is around 0.35 μm being applicable when the applied voltage is low (up to 3 V).

Meanwhile, in the case of the flash memory as described above, there has been a problem with chip size reduction: Since the memory cell needs to be supplied with high voltages, even to an MOS transistor used in a peripheral circuit such as a decoder a high voltage is applied. Accordingly, the gate oxide films of the MOS transistors must be formed to have a thickness of around 200 angstrom. Thus the transistors for the peripheral circuits need to be formed such that the gate lengths thereof are at least around 1 μm.

In order to reduce the area of the peripheral circuits, it is essential to reduce the voltages to be applied in writing and erasing. The reduction of the voltages can be partly realized by employing thinner film for the tunnel oxide film (the insulator film between the substrate and the floating gate) and for the ONO film (the insulator film between the floating gate and the control gate) in a memory cell. However, there is a possibility that the thinner films for the tunnel film and the ONO film will cause a decline in the reliability of the memory cell. There has been a limit, therefore, to the reduction of the voltage to be applied by using thinner film.

It will be hereafter explained the magnitude of voltage to be applied to the peripheral circuits, taking the second method for example, which is particularly designed to reduce the applied voltage.

In a peripheral circuit which serves to supply the drain with voltage, OV is applied to the P-type substrate and the maximum positive voltage (+5 V) in this the peripheral circuit is applied to the N-well in writing. Accordingly, to the transistors of the peripheral circuit 5 V is applied at maximum. In a peripheral circuit which supplies the control gate voltage, on the other hand, 0 V is applied to the P-type substrate and the maximum positive voltage (+12 V) that the peripheral circuit supplies is applied to the N-well in writing. Accordingly, to the transistors of the peripheral circuit 12 V is applied at maximum. Similarly, in erasing, 5 V is applied at maximum to a peripheral circuit which supplies the source voltage (+5 V). Since the peripheral circuit which supplies the control gate voltage operates not only in erasing but also in writing and reading, a voltage of at least Vcc needs to be applied to the N-well. Therefore to the transistors of the peripheral circuits a voltage of 12+Vcc is applied.

For the above described reasons, in order to reduce the employed voltage in the second method, it is necessary to reduce the voltage, that is, the absolute value of the voltage, applied to the control gate in erasing.

In the fourth method, the writing being operated in the same way as the erasing in the second method except that the states of the source and drain are switched each other, 12+Vcc at maximum is applied to the transistors of the peripheral circuit supplying voltage for the control gate. In erasing, 10 V at maximum is applied to the peripheral circuit supplying voltage to the control gate and 8+Vcc (3 to 5 V) at maximum is applied to the peripheral circuit supplying voltage for the source, according to the table 4.

Therefore, in order to reduce the employed voltage in the fourth method, it is necessary to reduce the voltage applied to the control gate in writing.

SUMMARY OF THE INVENTION

The present invention provides a method for rewriting a flash memory wherein a plurality of memory cells each of which comprises a pair of source and drain, a floating gate and a control gate are arranged in matrix in a first conductivity-type well formed in a second conductivity-type deep well formed in the first conductivity-type semiconductor substrate; in which the floating gate is charged with electrons when the flash memory is written and the floating gate is discharged of the electrons when the flash memory is erased; and in which the erasure of the flash memory is operated by applying to the first conductivity-type well a first positive voltage different from the potential of the substrate, applying to the source or the drain a second positive voltage higher than the first positive voltage and applying to the control gate a first negative voltage.

In another aspect, the present invention provides a method for rewriting a flash memory wherein a plurality of memory cells each of which comprises a pair of source and drain, a floating gate and a control gate are arranged in matrix in a first conductivity-type well formed in a second conductivity-type deep well formed in the first conductivity-type semiconductor substrate; in which the floating gate is discharged of electrons when the flash memory is written and the floating gate is charged with electrons when the flash memory is erased; and in which the writing of the flash memory is operated by applying to the first conductivity-type well a first positive voltage different from the potential of the substrate, applying to the source or the drain a second positive voltage higher than the first positive voltage and applying to the control gate a first negative voltage. In view of the above, it is an object of the present invention to provide a method for rewriting a flash memory wherein the voltage to be applied to the memory cells and peripheral circuits thereof is reduced in writing, in erasing and in reading.

DESCRIPTION OF THE PREFERRED EMBODIMENTS

Figure 1:
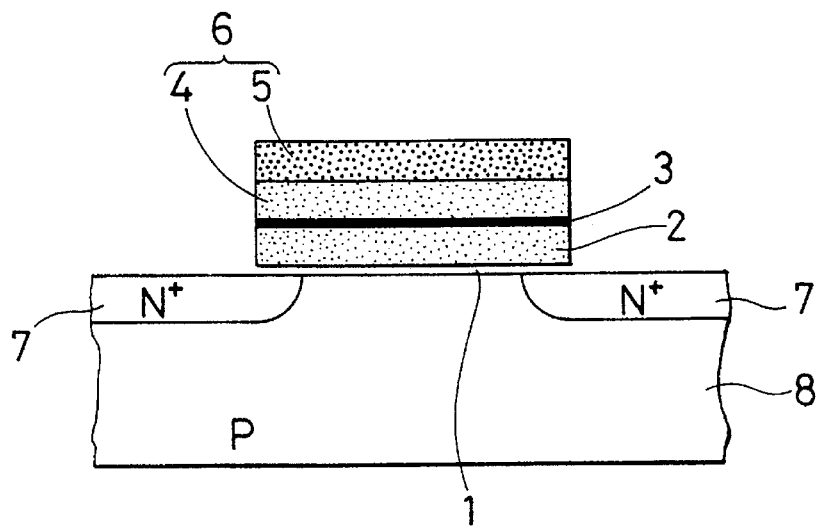
FIG. 1 is a schematic sectional view illustrating a construction of a memory cell in accordance with the present invention.

The memory cells for the flash memory in according with the invention are arranged in matrix in the first conductivity-type well formed in the second conductivity-type deep well on the first conductivity-type semiconductor substrate. Thus the first conductivity-type well is electrically separated from the first conductivity-type substrate and can be independently applied to a different voltage from that applied to the substrate. The sizes or the depths of the first and second conductivity-type wells are not specifically limited as long as the second conductivity-type deep well can be formed such that it has a depth enough to separate the first conductivity-type well from the substrate. The second conductivity-type deep well is preferably formed by implantation in a dose of about $1\times10^{11}/cm^2$ to $1\times10^{13}/cm^2$ at an implantation energy of about 1,000 to 4,000 keV so as to contain N- or P-type impurity ions at a concentration of about $1\times10^{16}/cm^3$ to $1\times10^{18}/cm^3$. Also the first conductivity-type well is preferably formed by implantation in a dose of about $1\times10^{11}/cm^2$ to $1\times10^{13}/cm^2$ at implantation energy of about 200 to 1,000 keV so as to contain N- or P-type impurity ions at a concentration of about $1\times10^{15}/cm^3$ to $1\times10^{17}/cm^3$. One or more peripheral circuits like a decoder may also be formed on the same substrate on which the memory cells are formed, in which case the peripheral circuits may be provided with one or more of the first or second conductivity-type wells, or may be provided with one or more of the first conductivity-type wells in the second conductivity-type wells or with one or more of the second conductivity-type wells in the first conductivity-type wells like the memory cells. Additionally, each well which has the same conductivity type may be connected with each other so long as the operation of each element of the memory cells and peripheral circuits is not affected.

Each memory cell is provided with a floating gate through a tunnel oxide film and a control gate and is provided with a source and drain in self-alignment thereto. The tunnel oxide film may be made of $SiO_2$ and the like with a uniform thickness of about 80 to 150 angstrom. The floating gate formed on the tunnel oxide film may be made of polysilicon and the like preferably with a thickness of about 500 to 2,000 angstrom. The control gate is formed on the floating gate with any insulating film sandwiched therebetween. The insulating film may be formed of $SiO_2$ film, SiN film or laminated film of two or more layers thereof, for example ONO film, but not limited thereto, the thickness thereof being about 140 to 200 angstrom (the thickness of the laminated film being calculated as $SiO_2$). Preferably the control gate may be formed of single-layer film made of polysilicon, silicide such as WSi, or polycide (composed of polysilicon and silicide films) or two or more laminated layer film thereof with a thickness of about 1,000 to 3,000 angstrom. The source and drain preferably contains the second conductivity-type impurity ions at a concentration of about $1\times10^{19}$ to $1\times10^{21}/cm^3$.

The flash memory with the construction as described above can be used in a way wherein the floating gate is charged with electrons in the written state and is discharged of electrons in the erased state, and also in the other way wherein the floating gate is discharged of electrons in the written state and is charged with electrons in the erased state.

One of the ways to charge the floating gate with electrons may comprises injecting hot electrons into the floating gate from a channel induced in the substrate by applying a certain voltage (Vs, e.g. 0 V) to the first conductivity-type substrate, 0 V to the first conductivity-type well, 0 V to the source, 4 to 7 V to the drain, and 9 to 12 V to the control gate.

One of the ways to discharge the floating gate of electrons may comprises applying a certain voltage (Vs, e.g. 0 V) to the first conductivity-type substrate, a first positive voltage (Vp1; e.g., lower than the power supply voltage, preferably lower than 3.3 V, more preferably about 2 to 3 V) which is different from Vs to the first conductive-type well, a second positive voltage (Vp2; for example about 6 to 9 V, preferably about 8 V) which is higher than the first positive voltage (Vs1) to the source or drain, and a first negative voltage (Vn1; for example about −8 to −12 V, preferably about −9 V) to the control gate. That is, the floating gate can be discharged of electrons by applying such voltages as meet the following inequality:

$$Vn1 < Vs < Vp1 \leq Vcc$$
$$Vp1 < Vp2$$

According to the method for rewriting a flash memory of the present invention, because the first conductivity-type well in which the memory cells are formed is separated from the first conductivity-type substrate by the second conductivity-type deep well, the application of voltage to the first conductivity-type well is operated independently of the substrate. That makes it possible to reduce the voltage applied to the control gate in discharging the electrons from the floating gate by applying to the first conductivity-type well a first positive voltage different from the potential of the substrate, to the source or drain a second positive voltage higher than the first positive voltage and to the control gate a first negative voltage. Accordingly, the reduced voltage is applied to the elements of the peripheral circuits such as transistors.

The present invention will hereinafter be described in detail by way of embodiments thereof shown in the attached drawings. These embodiments are not intended to limit the scope of the present invention.

FIG. 1 shows an example of a flash memory used in the method for rewriting a flash memory in accordance with the present invention.

A memory cell of the flash memory includes, as shown in FIG. 1, a tunnel oxide film 1 with a thickness of about 100 angstrom formed on P-well 8 which has impurity at a concentration of about $1\times10^{16}/cm^3$ to $1\times10^{17}/cm^3$, a floating gate 2 with a thickness of about 1,000 angstrom of $N^+$polysilicon formed on the tunnel oxide film 1, an ONO ($SiO_2$/SiN/$SiO_2$=50 angstrom/80 angstrom/60 angstrom) film 3 formed so as to cover the floating gate 2, a control gate 6 of two layer film of WSi 5/polysilicon 4 (WSi/Poly=1,000 angstrom/1,000 angstrom) formed on the ONO film 3, and source and drain 7 which are $N^+$ diffusion regions at an impurity concentration of about $1\times10^{20}/cm^3$, separately formed to each other in the P-well 8.

Figure 2:
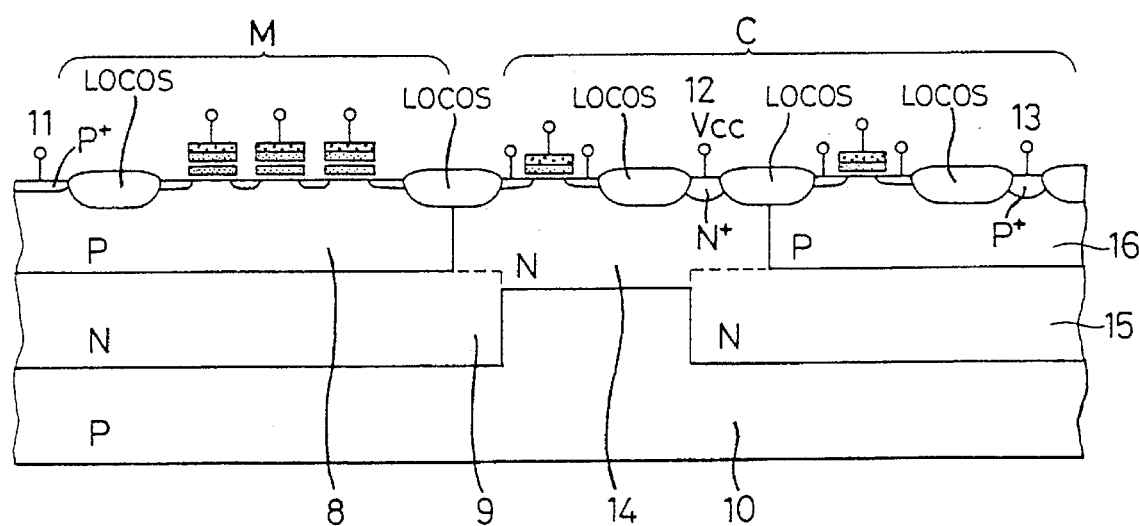
FIG. 2 is a schematic sectional view illustrating a construction of a flash memory in accordance with the present invention.

As shown in FIG. 2, since the memory cells constructed as described above are arranged on the P-well 8 formed in the deep N-well 9 formed in the P-type substrate 10, the memory cells are electrically separated from the P-type substrate 10. Accordingly, in the memory cell, the voltage can be independently applied to the P-well 8 via a terminal 11 regardless of the P-type substrate 10. The P-type substrate 10 is also provided with a P-well 16 formed in a deep N-well 15 therein and an N-well 14 for a peripheral circuit C. A desired voltage is applied to the P-well 16 via a terminal 13 and the power supply voltage Vcc is applied to the N-well 14. The deep N-well 9 for the cell array M, the N-well 14 and the deep N-well 15 for the peripheral circuit C may be formed such that they are in contact with each other for reducing the area of the whole semiconductor device including the cell array M and the peripheral circuit C. In this case, however, the voltage applied to the P-well should be Vcc or less in order to prevent the PN junction between the P-well and the deep N-well from being forward-biased.

Figure 3:
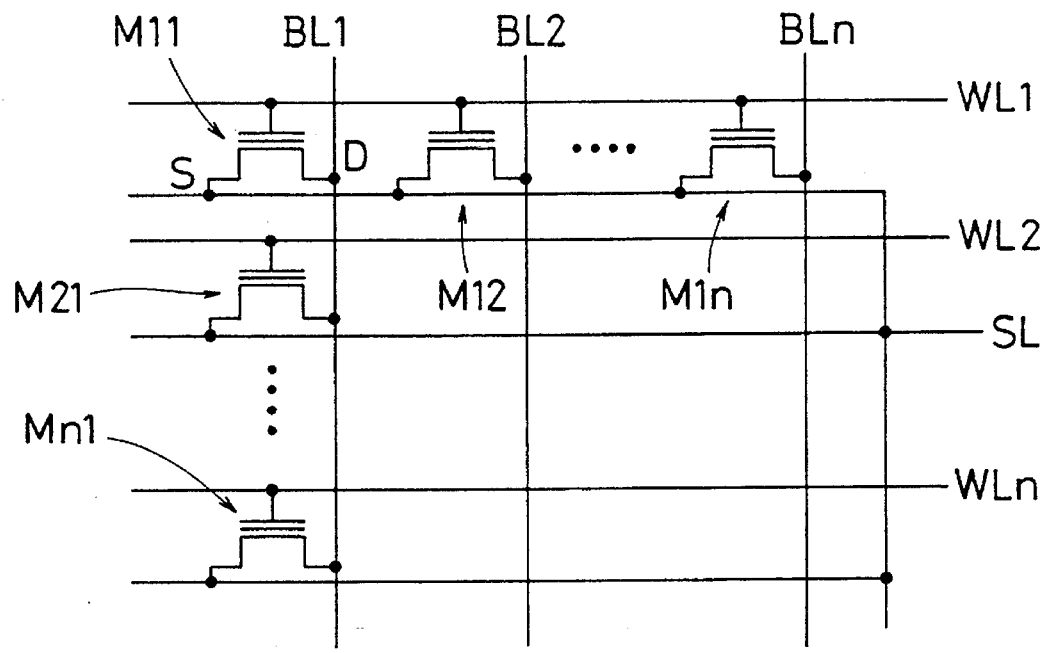
FIG. 3 is a diagram illustrating an equivalent circuit of a cell array of a flash memory in accordance with FIG. 2.
Figure 4:
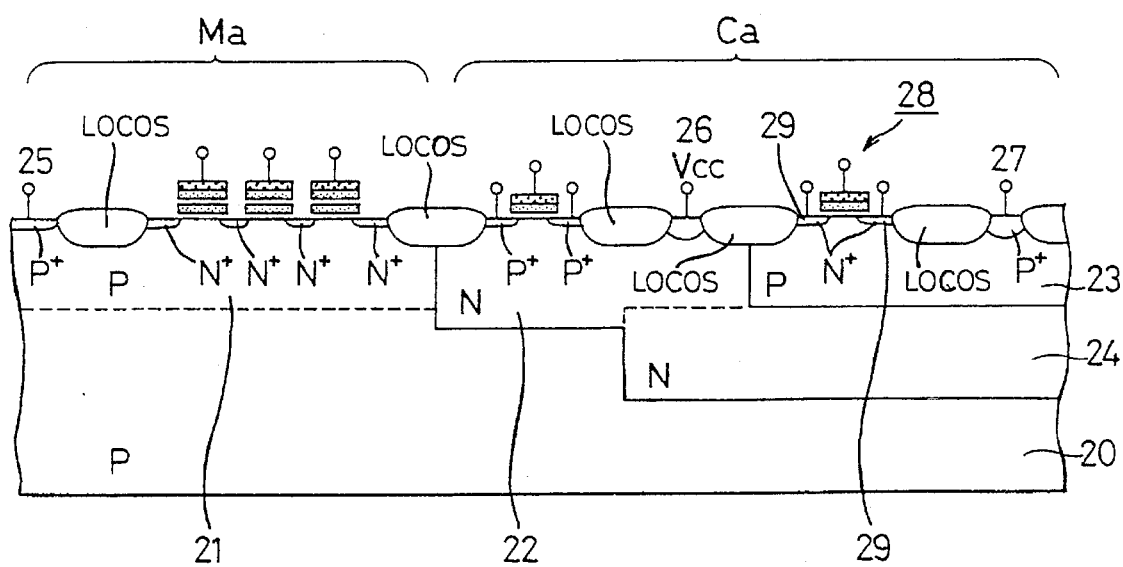
FIG. 4 is a schematic sectional view illustrating a construction of a conventional flash memory.
Figure 5:
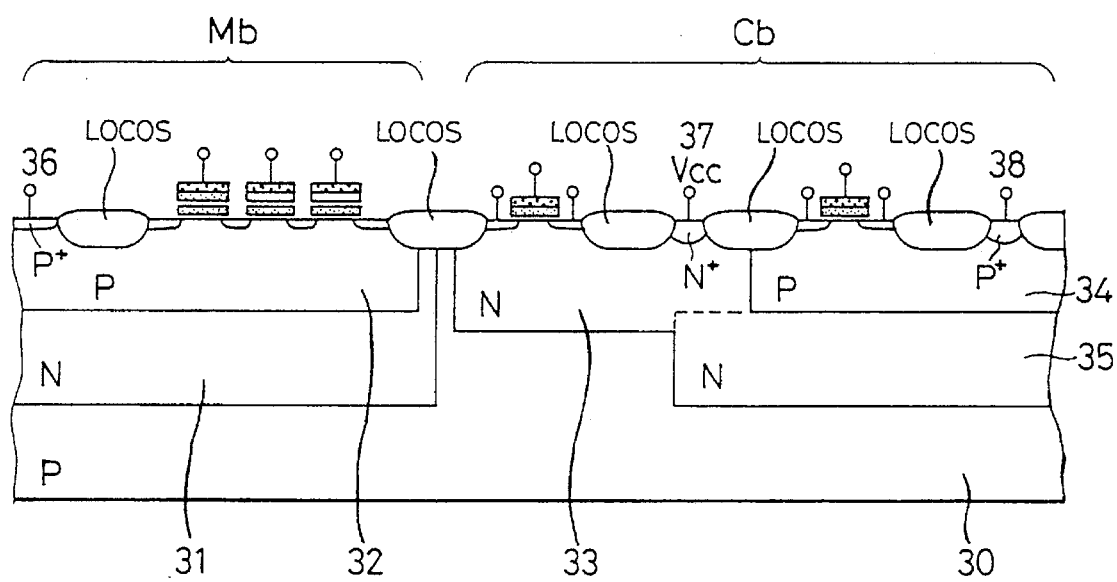
FIG. 5 is a schematic sectional view illustrating another conventional flash memory.

FIG. 3 shows a diagram explaining an equivalent circuit of a cell array for the above memory cells. In FIG. 3, each of the reference characters M11, M12, M1n, M21 and Mn1 denotes a memory cell. Each of the memory cells M11, M12 and M1n is connected to a word line WL1 through a control gate. The memory cell M21 is connected to a word line WL2 through a control gate, and the memory cell Mn1 is connected to a word line WLn through a control gate. Each of the memory cells is also connected to a common source line SL through a source. Each of the memory cells M11, M21, Mn1 is connected to a bit line BL1 through a drain, the memory cell M12 is connected to a bit line BL2 through a drain and the memory cell M1n is connected to a bit line BLn through a drain.

The table 6 explains an example of rewriting a memory cell constructed as described above.

TABLE 6

|  | Substrate | P-well | Source | Drain | Control Gate |
|---|---|---|---|---|---|
| Writing | 0 V | 0 V | 0 V | +5 V | +12 V |
| Erasing | 0 V | +3 V(Vcc) | +8 V | open | −9 V |
| Reading | 0 V | 0 V | 0 V | +2 V | +5 V |

In this example, the writing and reading are operated in the same way as in the second conventional method, but in erasing it is possible to reduce the negative voltage applied to the control gate from −12 V to −9 V by applying a voltage of +3 V to the P-well and keeping the substrate at 0 V. Accordingly, the maximum voltage applied to the transistors of the peripheral circuit supplying the voltage for the control gate is reduced from 12 V+Vcc to 9 V+Vcc. Although the voltage applied to the source must be increased according as the voltage applied to the control gate increases, the potential difference between the P-well and the source is still the same (5 V) as in the conventional methods and therefore the junction breakdown voltage does not need to be raised. In addition, since the voltage applied to the source in erasing is lower than the voltage necessary for the peripheral circuits in reading, the voltage applied to the source can be secured.

The table 7 explains another example of rewriting a memory cell constructed as described above.

TABLE 7

|  | Substrate | P-well | Source | Drain | Control Gate |
|---|---|---|---|---|---|
| Writing | 0 V | +3 V(Vcc) | open | +8 V | −9 V |
| Erasing | 0 V | −8 V | −8 V | open | +10 V |
| Reading | 0 V | 0 V | 0 V | +2 V | +5 V |

In this rewriting method, the erasing and reading are operated in the same way as in the fourth conventional method, but in writing it is possible to reduce the negative voltage applied to the control gate from −12 V to −9 V by applying a voltage of +3 V to the P-well and keeping the substrate at 0 V. Accordingly, the maximum voltage applied to the transistors of the peripheral circuit supplying the voltage for the control gate can be reduced from 12 V+Vcc to 9 V+Vcc.

In accordance with the above described embodiments, it was possible to thin the gate insulating films of the transistors in the peripheral circuits from 250 angstrom to 180 angstrom and to reduce the minimum transistor length from 1.2 μm to 0.8 μm, so that the area occupied by the peripheral circuit was reduced to half the size.

According to the rewriting method of the flash memory according to the present invention, the first conductivity-type well in which the memory cells are formed is separated from the first conductivity-type substrate by the second conductivity-type deep well. Therefore, to the first conductivity-type well a different voltage can be applied independently of the substrate, which makes it possible to reduce the voltage to be applied to the control gate in erasing of the first embodiment of this invention by applying to the first conductivity-type well a first positive voltage different from the potential of the substrate, to the source a second positive voltage higher than the first positive voltage, to the control gate a first negative voltage. Accordingly, the voltage applied to the elements such as transistors of the peripheral circuits is reduced. The transistors of the peripheral circuits, therefore, can be provided with thinner gate oxide films than in the conventional methods, which means that smaller transistors have become applicable for operating the peripheral circuits and, consequently, the flash memory at a higher speed. In addition, the reduction of the area occupied by the peripheral circuits contributes to the further integration of the flash memory and to the reduction of production costs.

When the power supply voltage is lower than 3.3 V, the voltage applied to the elements of the peripheral circuits can be further reduced, which realizes a peripheral circuit which shows still higher speed and is more integrated.

Further by using the rewriting method of the flash memory according to the second embodiment of the present invention, it is possible to reduce the voltage to be applied to the control gate in writing by applying to the first conductivity-type well a first positive voltage different from the potential of the substrate, to the source or drain a second positive voltage higher than the first positive voltage, to the control gate a first negative voltage. Accordingly, the voltage applied to the elements, such as transistors, of the peripheral circuits is reduced. From the above mentioned reasons, the higher speed and the further integration of the flash memory and the reduction of the costs thereof can be realized.

What is claimed is:

1. A method for rewriting a flash memory wherein a plurality of memory cells each of which comprises a pair of source and drain, a floating gate and a control gate are arranged in matrix in a first conductivity-type well formed in a second conductivity-type deep well formed in the first conductivity-type semiconductor substrate; and in which the floating gate is charged with electrons when the flash memory is written and the floating gate is discharged of the electrons when the flash memory is erased; and in which the erasure of the flash memory is operated by applying to the first conductivity-type well a first positive voltage different from the potential of the substrate, applying to the source or the drain a second positive voltage higher than the first positive voltage and applying to the control gate a first negative voltage.

2. A method for rewriting a flash memory according to claim 1 wherein a power supply voltage applied to the second conductivity-type well does not exceed 3.3 V.

3. A method for rewriting a flash memory according to claim 1 wherein a power supply voltage is applied to the second conductivity-type well and the first positive voltage does not exceed the power supply voltage.

4. A method for rewriting a flash memory wherein a plurality of memory cells each of which comprises a pair of source and drain, a floating gate and a control gate are arranged in matrix in a first conductivity-type well formed in a second conductivity-type deep well formed in the first conductivity-type semiconductor substrate; in which the floating gate is discharged of electrons when the flash memory is written and the floating gate is charged with electrons when the flash memory is erased; and in which the writing of the flash memory is operated by applying to the first conductivity-type well a first positive voltage different from the potential of the substrate, applying to the source or the drain a second positive voltage higher than the first positive voltage and applying to the control gate a first negative voltage.

5. A method for rewriting a flash memory according to claim 4 wherein a power supply voltage applied to the second conductivity-type well does not exceed 3.3 V.

6. A method for rewriting a flash memory according to claim 4 wherein a power supply voltage is applied to the second conductivity-type well and the first positive voltage does not exceed the power supply voltage.

* * * * *